June 18, 1974 W. N. JACOBUS. JR., ET AL 3,817,798

METHOD OF FORMING INTEGRATED SEMICONDUCTOR DEVICES WITH III-V COMPOUNDS

Filed Nov. 19, 1971

INVENTORS
WILLIAM N. JACOBUS, JR
SAN-MEI KU

BY Theodore E. Galanthay
ATTORNEY

United States Patent Office 3,817,798

Patented June 18, 1974

3,817,798

METHOD OF FORMING INTEGRATED SEMICONDUCTOR DEVICES WITH III–V COMPOUNDS

William N. Jacobus, Jr., Essex Junction, Vt., and San-Mei Ku, Poughkeepsie, N.Y., assignors to International Business Machines Corporation, Armonk, N.Y.

Filed Nov. 19, 1971, Ser. No. 200,438

Int. Cl. H01l 7/44

U.S. Cl. 148—187 12 Claims

ABSTRACT OF THE DISCLOSURE

The disclosure relates to integrated semiconductor devices formed with III–V compounds. As an example, a gallium arsenide substrate is coated with a layer of silicon dioxide prior to the application of a masking layer of silicon nitride. The silicon dioxide layer passes the zinc diffusant but prevents lateral diffusion spikes. This process is particularly useful for forming an array of closely spaced light emitting diodes.

BACKGROUND OF THE INVENTION

Description of the prior art

The prior art has generally had difficulties with providing arrays of closely spaced integrated devices using III–V compounds as substrates. It was noted early in the art that silicon dioxide would not mask impurities, such as zinc, to be diffused into gallium arsenide. It was found that a material such as silicon nitride which is impervious to a zinc diffusion had to be used. Silicon nitride, however, does not adhere well to the surface of gallium arsenide and at the high temperatures at which silicon nitride is deposited, the gallium arsenide surface decomposes. As the arsenic leaves the surface it becomes non-stoichiometric. Since an intimate contact between silicon nitride and gallium arsenide is not possible, lateral diffusions under the silicon nitride would inevitably result, thereby short circuiting adjacent semi-conductor devices.

A solution proposed by the prior art is to diffuse the zinc into the gallium arsenide in two steps. During a first step, a very shallow diffusion is made during a very brief interval of time into the desired junction area. This is followed by another silicon nitride masking step which exposes a much smaller area than the desired junction, and the remainder of the diffusion takes place through this much smaller opening. Any out-diffusions from this smaller opening would hopefully not extend beyond the desired area of the junction. This process, although permitting the use of silicon nitride as the sole masking material, has the process disadvantage of requiring two diffusions. Moreover, the diffusion will be much deeper near the center area of the opening resulting in impaired emission, if the device is to be used as a light emitting diode.

Another attempt at preventing lateral diffusions in the formation of gallium arsenide semiconductor devices has been to coat the silicon nitride mask layer with a layer of silicon dioxide and subsequently diffuse the dopant through the silicon dioxide layer. In theory, this is a solution, however, in actual practice it was found difficult to properly deposit the silicon dioxide into the openings in the silicon nitride masking layer. Defects in the silicon dioxide layer, such as pin holes, would be particularly prevalent near the corners formed by the silicon nitride and gallium arsenide. Of course, lateral diffusion spikes would form through these imperfections in the oxide again short circuiting closely spaced semiconductor devices.

Various other techniques such as attempting to mask the gallium arsenide with a material that would also adhere well to the surface were attempted by the prior art. None of these techniques have provided a simple method for providing closely spaced semiconductor devices in a gallium arsenide substrate.

SUMMARY OF THE INVENTION

Accordingly, it is a primary object of this invention to form closely spaced semiconductor devices in a III–V compound substrate.

It is a further object of this invention to prevent excessive lateral diffusions when diffusing impurities into the surface of a III–V compound substrate.

It is a still further object of this invention to reduce surface concentration and form a uniformly shallow diffused junction in a III–V compound substrate.

Lastly, it is an object of this invention to prevent surface decomposition of a III–V compound semiconductor substrate, during the diffusion process.

In order to overcome the disadvantages of the prior art and achieve the stated objects, and in accordance with the present invention, a semiconductor substrate from the group of III–V compounds is doped with an impurity of a first conductivity type. A first layer of a first material, such as silicon dioxide, is deposited on at least one major surface of the substrate. A second layer of a second material, such as silicon nitride, is deposited over the silicon dioxide and has openings or "windows" selectively opened therein. Diffusion of an impurity of a second conductivity type then takes place through the silicon dioxide layer. In this way, excessive lateral out-diffusions are prevented and devices may be closely spaced. Additionally, the junction is inherently passivated since once the silicon dioxide layer is deposited, the junction is never exposed again. This prevents surface decomposition of the III–V semiconductor compound and preserves a stoichiometric surface. A uniformly shallow junction is thereby obtained with a one step diffusion process.

The foregoing and other objects, features and advantages of our invention will be apparent from the following and more particular description of the preferred embodiments as illustrated in the accompanying drawings.

DESCRIPTION OF THE PREFERRED EMBODIMENTS

Figure 1:
FIG. 1 shows an enlarged cross-sectional view of a III–V compound semiconductor.

In accordance with the present invention, a substrate 10 consisting of a III–V compound semiconductor, as shown in FIG. 1, is provided. Gallium arsenide (GaAs) has been most prevalently used, although gallium phosphide (GaP), aluminum arsenide (AlAs) and boron phosphide (BP) are also suitable. Similarly, mixed crystals of the III–V compounds such as gallium arsenide phosphide ($GaAs_xP_{1-x}$) will be readily recognized as comparable by those skilled in the art. The gallium arsenide, for example, substrate is doped with an N-type impurity such as tin to a concentration of approximately $2\times10^{18}$. Other materials such as silicon and tellurium may also be used as N dopants. The typical thickness of the substrate shown in FIG. 1 is 10 to 20 mils and has a diameter of 2 to 3 centimeters. Prior to the various depositions and diffusions described herein, the wafer is cleaned in etchants as known in the art and rinsed thoroughly in de-ionized water.

Figure 2:
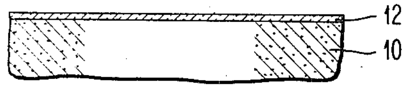
FIG. 2 shows a layer of material such as silicon dioxide in adherent contact with the top surface of the III–V compound semiconductor substrate.

In order to protect the gallium arsenide surface in subsequent high temperature processes and prevent lateral diffusions in accordance with the present invention, the substrate is coated with a dielectric material adhering well to the surface. This material should also have the characteristic of being substantially transparent to the diffusant of a conductivity type opposite from the doping impurity used for the substrate. As shown in FIG. 2, for example, a layer 12 of silicon dioxide is pyrolytically deposited in about six minutes at a temperature of approximately 475° C. The source of the pyrolytic oxide is a mixture of silane ($SiH_4$) and oxygen. It is critical that the deposition of the oxide takes place at a temperature well below 550° C. because above that temperature the gallium arsenide surface decomposes. Decomposition occurs as arsenic leaves the surface so that the surface becomes nonstoichiometric. In addition to adhering well to the gallium arsenide surface, silicon dioxide has the additional advantageous property of being substantially transparent to the diffusion of zinc, a typical P-type impurity to be diffused into the gallium arsenide surface.

It is important here to note that the problems observed and solved with respect to gallium arsenide substrates do not occur with a single element substrate such as silicon. First of all, silicon oxidizes naturally. Secondly, silicon dioxide forms a suitable mask for most dopants used for silicon. Moreover, the silicon surface does not decompose in the presence of high temperatures required for the deposition of silicon nitride so that there is no adhesion problem with silicon nitride to a silicon surface. The present invention has the additional advantage that from the time the silicon dioxide is deposited, all future junctions are inherently passivated and never exposed again.

Figure 3:
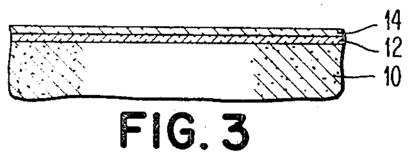
FIG. 3 shows a layer of a material such as silicon nitride covering the silicon dioxide layer.

Immediately after the oxide has been deposited, a second layer 14 of material which is substantially impervious to the diffusion of an impurity such as zinc, is deposited. A preferred material is silicon nitride, although equivalents such as $Al_2O_3$, phospho-silicate glass, other insulating dielectrics, as well as various metals are well known in the art. The silicon nitride is deposited in about seven minutes at a temperature of approximately 900° C. It is deposited from a mixture of silane ($SiH_4$) and ammonia gas ($NH_3$). It is noteworthy that the temperature at which the nitride is deposited is well over the 550° C., which is approximately the decomposition temperature of the gallium arsenide surface. In accordance with the present invention, the surface does not break down because it is protected by the first silicon dioxide layer. FIG. 3 shows the device after the silicon nitride 14 has been deposited.

Figure 4:
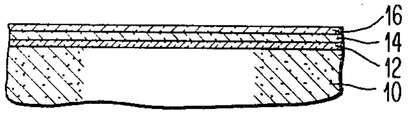
FIG. 4 shows another layer of a material such as silicon dioxide covering the layer of silicon nitride.

Refer now to FIG. 4 showing a layer 16 of pyrolytic oxide over the silicon nitride. The purpose of this second layer 16 of silicon dioxide is to help mask the silicon nutride, a process well known in the art. If hot phosphoric acid is used for etching, hardened photoresist is not sufficient to protect masked areas so that the last mentioned oxide layer 16 is required.

Figure 5:
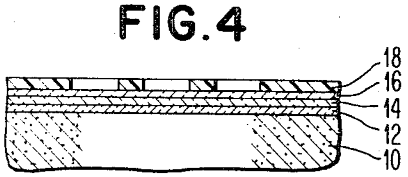
FIG. 5 shows a developed photoresist covering selective portions of the second silicon dioxide layer.

As shown in FIG. 5, the layer of photoresist 18 has been applied, exposed, developed and baked. A standard negative photoresist is KTFR, a product of the Kodak Company, and is spun on. Photoresist processes of this type are well known to those skilled in the art.

Figure 6:
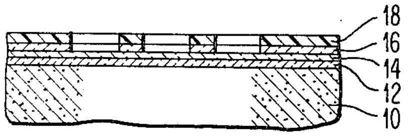
FIG. 6 shows an enlarged cross-section after the selective etching of the second silicon dioxide layer.
Figure 7:
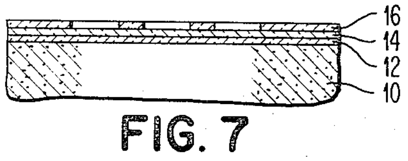
FIG. 7 shows an enlarged cross-section after removal of the photoresist layer.

Referring now to FIG. 6, the top silicon dioxide layer 16 is shown as having been etched by a buffered hydrogen fluoride (HF) solution at room temperature. It is well known, of course, that this last mentioned layer can be a substance other than silicon dioxide and that silicon dioxide can be etched by other means. FIG. 7 shows the photoresist 18 as having been removed. The wafer is then rinsed in de-ionized water in preparation for the nitride etch.

Figure 8:
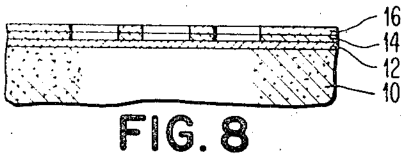
FIG. 8 shows an enlarged cross-section after selective etching of the silicon nitride layer.

FIG. 8 shows the nitride 14 as having been etched using the silicon dioxide layer 16 as a mask. One of the preferred etchants for silicon nitride is hot phosphoric acid. It is important to pick an etchant of the type which will selectively etch the silicon nitride with minimal attack of the silicon dioxide. An etching duration of approximately ten minutes at a temperature in the range of 178–188° C. provides suitable results. As can be seen, the temperature is relatively critical. The wafer is then rinsed in de-ionized water in preparation for the diffusion step.

Figure 9:
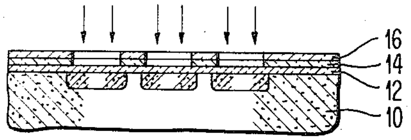
FIG. 9 shows the diffusion of the zinc through the first silicon dioxide layer.

As shown in FIG. 9, diffusion takes place through the silicon dioxide layer 12 using a P-type impurity such as zinc; magnesium or cadmium, etc., being also suitable impurities for this purpose. Diffusion takes place in a sealed capsule at approximately 900° C. for approximately 200 minutes. This results in a uniform shallow junction depth of about five to ten microns. As a critically unique aspect of this invention, lateral spreading of the diffusion is limited substantially to the same depth as the diffusion is into the gallium arsenide substrate.

Figure 10:
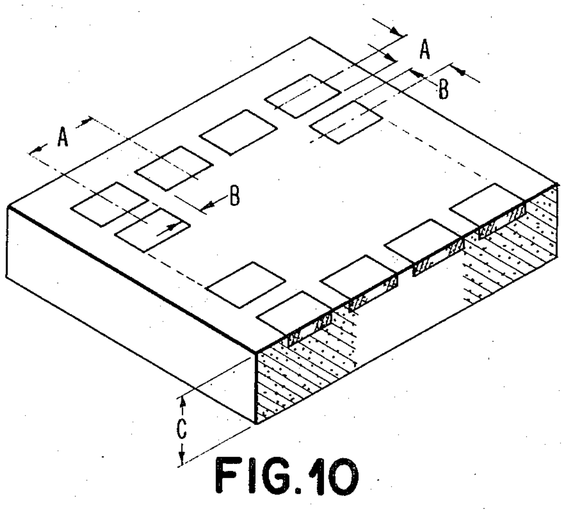
FIG. 10 shows a complete array of light emitting diodes including typical dimensions.

The devices are now completely formed at a spacing shown in FIG. 10. Exemplary dimensions as indicated in FIG. 10 are as follows:

A=5 mils (center to center)
B=.8 mils (spacing between devices)
C=10–20 mils (wafer thickness)

This spacing is critical in the sense that there is a need to use as little real estate space as possible. Also, when light emitting diodes are produced by this process, more intricate patterns can be emitted if the diodes are more closely spaced. Individual chips can be cut from any portion of the wafer. For example, one chip fabricated in accordance with this invention is 120 devices long and only one device wide. By light emitting diodes, of course, is meant visible as well as invisible light. Therefore, as described in the preferred embodiment, the gallium arsenide produces infrared light. Gallium arsenide phosphide provides red to orange. Other III–V compounds such as gallium phosphide and aluminum arsenide produce green as well as various other colors. These light emitting diodes have numerous applications in not only displays but also items of manufacture such as non-impact printers and optical character readers. The process of this invention is of course not only applicable to light emitting diodes but can also be used to make gallium arsenide field effect transistors, and gallium arsenide transistors. However, in manufacturing light emitting diodes, the uniformly shallow junction depth and low surface concentration ($C_0$) afforded by this method, provides light emitting diodes having an output of 60–100 microwatts with the dimensions shown, which is at least two times that of any device presently known in the art.

Figure 11:
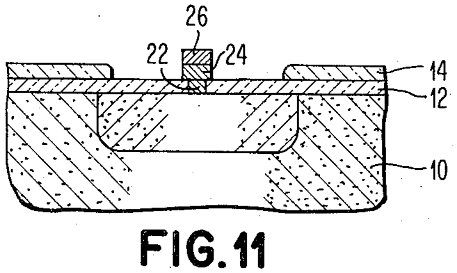
FIG. 11 shows one semiconductor device with the metal bonding pad.

In order to complete the light emitting diode structure depicted in FIG. 10, refer now to FIG. 11 for the metal bonding pad structure. Those skilled in the art, of course, will recognize that many types of metallization are possible. In our preferred embodiment, a small contact hole or strip is opened in oxide layer 12, with a buffered HF solution and metal or alloy such as gold zinc (AuZn) 22 is deposited by either electroless or electrolytic plating onto a small exposed portion of the GaAs surface 10.

The resultant structure is sintered at approximately 400° C. for approximately fifteen minutes so that the metal is sintered into the surface of the semiconductor. First chrome 24 then gold 26 are deposited over the entire top surface. Photoresist is then applied and contact pads are formed by subtractive etching of the undesired metal. First the gold is removed by subtractive etching and then the photoresist is removed. The resulting gold pads serve as masks for subsequent subtractive etching of the underlying chrome pad. This results in the structure shown in FIG. 11.

What has been described is a unique process for forming closely spaced integrated semiconductor devices in a III–V compound semiconductor substrate without the normally attendant problems of short-circuiting because of lateral diffusions. The junctions have uniform depth and have a low surface concentration uniquely adapting resultant devices for use as light emitting diodes (LED's). Moreover, devices produced by this technique are inherently passivated in that the junction is not exposed during the processing except in the contact area.

While the invention has been shown and particularly described with reference to preferred embodiments, it will be understood by those skilled in the art that various changes in form and detail may be made therein without departing from the spirit and scope of the invention.

What is claimed is:

1. A method of preventing lateral diffusion spikes in a process for fabricating an array of closely spaced integrated semiconductor devices comprising the steps of:

providing a semiconductor substrate selected from the group consisting of III–V compounds and mixed III–V compounds having a stoichiometric major surface and doped with an N-type impurity of a first conductivity type;

preserving the stoichiometric major surface by depositing a first layer of oxide material on said major surface of said substrate, at a temperature less than the decomposition temperature of said substrate, said oxide material adhering well to the said surface of said substrate;

depositing a second layer of a material over said first layer, said material being substantially impervious to the diffusion of a P-type impurity of the second conductivity type;

closely spacing a plurality of preferentially etched windows in said second layer thereby exposing the top surface of said first layer; and forming uniformly shallow P-N junctions in said substrate substantially under said etched windows by diffusing a P-type impurity through said oxide material, the concentration of said P-type impurity being less than at the oxide-substrate interface than at the top surface of said first layer.

2. A method as in claim 1 wherein said first layer of oxide material is an oxide of silicon pyrolytically deposited at less than approximately 550° C.

3. A method as in claim 1 wherein the substrate consists of gallium arsenide.

4. A method as in claim 1 wherein said second layer of material is a nitride of silicon.

5. A method as in claim 1 wherein prior to the step of closely spacing a plurality of preferentially etched windows in said second layer there are included the steps of:

depositing a third layer of a material over said second layer and etching windows in said third layer.

6. A method as in claim 1 wherein the N-type impurity of said first conductivity type consists of a material selected from the group including silicon, tin, and tellurium.

7. A method as in claim 1 wherein the P-type impurity of the second conductivity type consists of a material selected from a group including zinc and cadmium.

8. A method as in claim 1 comprising the additional steps of:

forming a metallic contact to the substrate through an opening in said first layer, said opening through said first layer being in a relatively small portion of said etched windows.

9. A method of preventing lateral diffusion spikes in a process for fabricating an array of closely spaced integrated semiconductor devices comprising the steps of:

providing a gallium arsenide substrate having a stoichiometric major surface and doped with an N-type impurity of a first conductivity type;

preserving the stoichiometric major surface by depositing a first layer of oxide material on said major surface of said substrate, at a temperature less than the decomposition tempertaure of said substrate, said oxide material adhering well to the said surface of said substrate and covering the substrate until a contact is to be applied;

depositing a second layer of a material including silicon nitride over said first layer, said material being substantially impervious to the diffusion of a P-type impurity of the second conductivity type;

closely spacing a plurality of preferentially etched windows in said second layer thereby exposing the top surface of said first layer; and forming uniformly shallow P-N junctions in said substate substantially under said etched windows by diffusing a P-type impurity including zinc through said oxide material, the concentration of said P-type impurity being less at the oxide-substrate interface than at the top surface of said first layer.

10. A method as in claim 9 wherein prior to the step of closely spacing a plurality of preferentially etched windows are included the steps of:

depositing a third layer of oxide material and etching windows in said third layer.

11. A method as in claim 9 wherein instead of the step of providing a gallium arsenide substrate, there is substituted the step of:

providing a gallium arsenide phosphide substrate having a stoichiometric major surface and doped with an N-type impurity of a first conductivity type.

12. A method as in claim 11 wherein prior to the step of closely spacing a plurality of preferentially etched windows there are included the steps of:

depositing a third layer of oxide material and etching windows in said third layer.

References Cited

UNITED STATES PATENTS

| | | | |
|---|---|---|---|
| 3,477,886 | 11/1969 | Ehlenberger | 148—187 |
| 3,479,237 | 11/1969 | Bergh et al. | 156—11 |
| 3,585,089 | 6/1971 | Preece et al. | 148—187 |
| 3,636,617 | 1/1972 | Schmidt et al. | 29—578 |
| 3,313,663 | 4/1967 | Yeh et al. | 148—187 |

FOREIGN PATENTS

| | | | |
|---|---|---|---|
| 1,159,637 | 7/1969 | Great Britain | 148—187 |

OTHER REFERENCES

Becke et al.: "GaAs FETS Outperform Conventional Si MOS Devices," Electronics, vol. 40, June 12, 1967, pp. 82–90.

HYLAND BIZOT, Primary Examiner

J. M. DAVIS, Assistant Examiner

U.S. Cl. X.R.

29—578; 148—1.5; 156—11; 317—235